US 6,718,775 B2

(12) United States Patent
Colombo et al.

(10) Patent No.: US 6,718,775 B2
(45) Date of Patent: Apr. 13, 2004

(54) DUAL CHAMBER COOLING SYSTEM WITH CRYOGENIC AND NON-CRYOGENIC CHAMBERS FOR ULTRA HIGH VACUUM SYSTEM

(75) Inventors: Paul E. Colombo, White Bear Lake, MN (US); Scott Wayne Priddy, Saint Louis Park, MN (US)

(73) Assignee: Applied EPI, Inc., St. Paul, MN (US)

( * ) Notice: Subject to any disclaimer, the term of this patent is extended or adjusted under 35 U.S.C. 154(b) by 0 days.

(21) Appl. No.: 10/209,111

(22) Filed: Jul. 30, 2002

(65) Prior Publication Data

US 2004/0020219 A1 Feb. 5, 2004

(51) Int. Cl.[7] ............... B01D 8/00; F17C 9/02; C23C 14/00
(52) U.S. Cl. ............ 62/55.5; 62/50.5; 118/688
(58) Field of Search ............... 62/50.7, 55.5, 62/50.2, 57.1; 118/688

(56) References Cited

U.S. PATENT DOCUMENTS

| | | | | |
|---|---|---|---|---|
| 2,985,356 A | * | 5/1961 | Beecher | 62/55.5 |
| 3,256,706 A | * | 6/1966 | Hansen | 62/55.5 |
| 3,292,383 A | | 12/1966 | Charles et al. | |
| 3,371,499 A | | 3/1968 | Hagenbach et al. | |
| 3,390,536 A | * | 7/1968 | Kreisman | 62/55.5 |
| 3,525,229 A | * | 8/1970 | Denhoy | 62/55.5 |
| 4,009,585 A | | 3/1977 | Larin | |
| 4,214,853 A | * | 7/1980 | Mahl | 417/154 |
| 4,873,833 A | | 10/1989 | Pfeiffer et al. | |
| 5,426,949 A | * | 6/1995 | Saho et al. | 62/51.1 |
| 5,788,776 A | | 8/1998 | Colombo | |
| 5,951,767 A | | 9/1999 | Colombo | |
| 6,367,267 B1 | * | 4/2002 | Colombo | 62/55.5 |

OTHER PUBLICATIONS

Declaration of Thomas E. Bird, including Exhibit A, dated Aug. 29, 2001, originally filed in Appl. Ser. No. 09/668,772, now U.S. patent No. 6,367,267.

* cited by examiner

Primary Examiner—William C. Doerrler
(74) Attorney, Agent, or Firm—Merchant & Gould P.C.

(57) ABSTRACT

An integrated phase separator for use in an ultra high vacuum system, for example, a molecular beam epitaxy system, is described. The vacuum chamber has a cryogenic panel disposed therein. The cryogenic panel includes a cryogenic shroud region and a phase separator region. Liquid nitrogen is introduced into the cryogenic panel via an inlet line. As the liquid nitrogen warms and vaporizes, nitrogen vapor rises within the shroud. The phase separator region within the cryogenic panel provides a near atmospheric pressure vapor barrier over the liquid nitrogen so that the nitrogen vapor may escape smoothly through the outlet of the panel, without forming gas bursts. Also, the phase separator region is vacuum jacketed to prevent cryogenic shroud surface temperature changes due to variations in liquid nitrogen levels, thereby increasing the cryogenic shroud's pumping stability. In one embodiment, used in molecular beam epitaxy (MBE), the cryopanel is divided into first and second cooling chambers. The first cooling chamber contains liquid nitrogen and surrounds the substrates to be coated, while the second cooling chamber contains a different fluid such as water, and surrounds the effusion cells so as to dissipate heat generated during the operation of effusion cells.

21 Claims, 5 Drawing Sheets

DUAL CHAMBER COOLING SYSTEM WITH CRYOGENIC AND NON-CRYOGENIC CHAMBERS FOR ULTRA HIGH VACUUM SYSTEM

FIELD OF THE INVENTION

The present invention is directed to a phase separator for use in an ultra high vacuum system, for example, a molecular beam epitaxy ("MBE") system and, more particularly, to a phase separator integrated into a cryogenic reactor chamber within the MBE system that facilitates the smooth flow of liquid nitrogen into and gaseous nitrogen out of the system.

BACKGROUND OF THE INVENTION

Ultra high vacuum systems are used in many manufacturing, scientific and other applications. Throughout this application, ultra high vacuum ("UHV") systems are defined as those having base system pressures less than approximately $10^{-8}$ Torr. One example of a system employing UHV is epitaxial crystal growth.

One such epitaxial crystal growth application employing UHV is molecular beam epitaxy ("MBE"). In MBE, thin films of material are deposited onto a substrate by directing molecular or atomic beams onto a substrate. Deposited atoms and molecules migrate to energetically preferred lattice positions on a heated substrate, yielding film growth of high crystalline quality and purity, and optimum thickness uniformity. MBE is widely used in compound semiconductor research and in the semiconductor device fabrication industry, for thin-film deposition of elemental semiconductors, metals and insulating layers.

Purity of the growing films depends critically on the operating pressure of the growth chamber and the residual gas composition. To ensure the high level of purity required, for example, by the semiconductor industry, the MBE growth chamber base pressure is necessarily in the ultra high vacuum range (UHV), typically less than $10^{-10}$ Torr.

Furthermore, film growth rates, film composition and film doping levels depend critically on the operating temperature of numerous critical components of the growth system, for example, the source cells and the substrate carrier. To this end, MBE growth chambers often employ a liquid nitrogen filled cryogenically cooled shroud ("cryo-shroud") surrounding interior elements and enclosing the active growth region. This cryo-shroud serves a multiplicity of purposes: 1) to enhance the level of vacuum in the UHV chamber by condensing volatile residual species not removed or trapped by the vacuum pumping system i.e. providing a cryo-pumping action, 2) to enhance the thermal stability and temperature control of critical growth reactor components, and 3) to condense and trap source material emitted from the effusion cells but not incorporated into the growing film.

The implementation of a liquid nitrogen filled cryo-shroud in an UHV system requires a phase separator that allows the escape of gaseous nitrogen generated by the vaporization of the liquid nitrogen as heat is absorbed by the cryo-shroud. The phase separator also enables a replenishing feed of liquid nitrogen into the cryo-shroud to maintain the desired operating temperature. A conventional implementation of such an external phase separator is shown in FIG. 1.

As shown in FIG. 1, vacuum chamber 100 contains a cryogenic shroud 110 having a liquid nitrogen inlet 112 and a liquid nitrogen outlet 114. A phase separator 120 is connected to inlet and outlet 112, 114 via ports 132, 134 and lines 122, 124, respectively. Liquid nitrogen at or below its atmospheric boiling point of 77.5° K (−195.5° C.) is introduced into phase separator 120 via inlet 142 and flows through port 132 and line 122 and enters cryo-shroud 110 via inlet 112. As nitrogen in cryo-shroud 110 warms to the boiling point due to heat absorbed from vacuum chamber 100, vapor forms within the body of the liquid and bubbles rise by gravity to the top of the cryo-shroud and ultimately out through outlet 114, liquid-filled exhaust line 124, port 134 and gaseous nitrogen escapes via exhaust 144. The formation and flow of these vapor bubbles result in the turbulence and seething normally associated with boiling action, causing mixing effects with the liquid-state nitrogen and counteracting the natural tendency for colder, more dense liquid to settle into the lower portion of the cryo-shroud.

Several problems are associated with a conventional phase separator design. First, the small cross-sectional area of the exhaust line results in a flow restriction for the vapor bubbles and formation of a "frothing", boiling region in the upper section of the cryo-panel. This region will be elevated in temperature above the liquid nitrogen boiling point, resulting in poor heat absorption from the adjacent cryo-shroud surface. Second, large pockets of gas can accumulate within the body of the cryo-shroud before ultimately breaking loose and flowing to the exhaust line, giving rise to local, temporary warming of the cryo-shroud surface at the location of the trapped gas pocket. Third, the configuration results in an operating pressure within the cryo-shroud considerably above atmospheric pressure. This causes an elevation of the liquid nitrogen boiling point and an overall rise in the operating temperature of the cryo-shroud. A temperature rise of even a few degrees can significantly degrade the cryo-pumping performance of the cryo-shroud. For example, the vapor pressure of carbon dioxide ($CO_2$) increases exponentially with temperature from $10^{-9}$ Torr at 72.1° K to $10^{-7}$ Torr at 80.6° K. The limited surface area of the gas-to-liquid interface in the exhaust line enhances these problems.

In addition to the problems associated with conventional phase separator designs, cryogenic fluids are expensive, which raises the cost of the entire deposition process. The deposition process generates substantial amounts of heat, which causes the cryogenic fluid to evaporate very quickly, thus reducing the effectiveness of the overall cooling system. Moreover, once vaporized due to the extreme amount of heat generated during the deposition process, the cryogenic fluid is no longer useful. Therefore, substantial amounts of cryogenic fluid must be used to cool the system.

SUMMARY OF THE INVENTION

The present invention overcomes the above difficulties in part by adding a non-cryogenic cooling panel to the vacuum chamber. The cooling system within the vacuum chamber thus comprises a cryo-panel or cryogenic panel and a non-cryogenic panel. This non-cryogenic panel is filled with a circulating fluid with a greater heat absorption capacity than the cryogenic fluid in the cryo-panel. The non-cryogenic fluid functions to efficiently dissipate the large amounts of heat produced during the operation of the MBE system, thereby prolonging the supply of cryogenic fluid and reducing costs.

The present invention further overcomes the above[[-]] difficulties by integrating the phase separator for the cryo-panel within the vacuum chamber, thus eliminating the lines of relatively small diameter connecting the vacuum chamber to an external phase separator. According to the present invention, the cryo-panel disposed within a vacuum chamber, (e.g., an MBE reaction chamber), includes a cryogenic shroud region and a phase separator region. Liquid nitrogen is introduced into the cryo-panel via an inlet line. As the liquid nitrogen warms and vaporizes, nitrogen vapor rises within the shroud. The phase separator region within the cryo-panel provides a large area vapor-to-liquid interface held at near atmospheric pressure, ensuring that nitrogen vapor may escape the panel smoothly, without forming gas bursts, and with minimal turbulence and general disturbance of the liquid reservoir.

The upper end of the cryogenic panel containing the phase separator region preferably is vacuum jacketed. The liquid nitrogen feed mechanism is designed such that the liquid-to-vapor phase boundary is always held at a level within the region encompassed by the vacuum jacket. This prevents exposed external surfaces of the cryo-shroud from varying in temperature from the nominal 77.4° K associated with the internal liquid nitrogen bath, thereby optimizing its performance and thermal stability.

The flow of liquid nitrogen into the cryogenic panel will generally be intermittent, gated by a level sensor located within the phase separator and a fill mechanism. Following a significant time period of no flow, the feed lines will have warmed considerably and liquid nitrogen may vaporize as it flows from the bulk supply tank to the cryogenic panel. This can give rise to high velocity gas injection into the phase separator region and mixing effects between the vapor and liquid phases, until the delivery line has sufficiently cooled. Normal flow of liquid nitrogen into the system can have similar, although less severe, effects. Terminating the inlet line in a "shower head" arrangement that disperses the gas or liquid flow and directs it in a generally horizontal direction can minimize turbulence in the liquid nitrogen reservoir, and general disturbance of the vapor/liquid interface.

Thus according to one aspect of the invention the cooling system in the vacuum chamber comprises first and second cooling sections. The first section, comprises a cryogenic panel, containing liquid nitrogen and a phase separator region. The second section, comprising a non-cryogenic heat absorption panel, is cooled to non-cryogenic temperatures, providing optimal dissipation of heat generated during the operation of the MBE system. In a preferred embodiment of the non-cryogenic cooling panel at least one thin curved fill head and at least one radially placed hole in the main supply ring continuously or intermittently spray water into the closed second portion. Those skilled in the art will appreciate that additional cooling fluids may be utilized without altering the inventive concept disclosed herein.

DETAILED DESCRIPTION OF THE PREFERRED EMBODIMENTS

A dual cooling panel having cryogenic and non-cryogenic cooing panels with an integrated phase separator for an UHV system according to a preferred embodiment of the present invention is shown in FIGS. 2–7. Throughout the drawings, like numerals are used to indicate like elements. The cryo-panel portion of the invention is illustrated in FIGS. 2–5.

Figure 6:
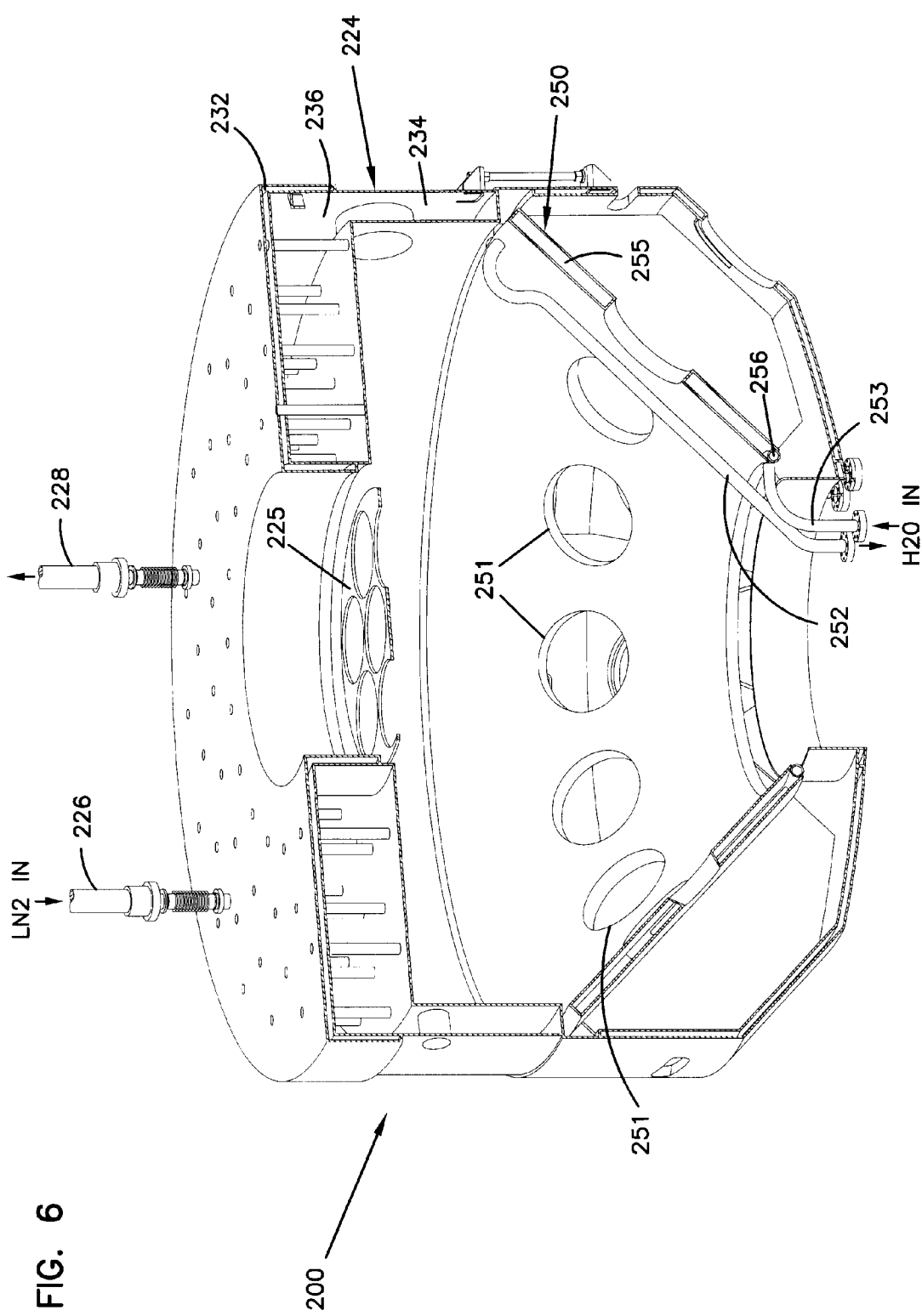
FIG. 6 is a cross-sectional view of a preferred embodiment of the present invention showing the dual cryo-panel and non-cryogenic cooling panel features.

FIG. 6 shows a cross-sectional view of the "dual panel" feature of the invention employed in an MBE system. As shown in FIG. 6, a cooling panel 200 has been split into a cryogenic cooling panel 224 and a non-cryogenic heat absorption panel 250. Both cooling panels 224 and 250 are mountable within a vacuum chamber of a UHV MBE system. The cryogenic panel 224 surrounds substrate holder 225 of the MBE system, which supports the substrates to be coated. The cryogenic panel has a cryo-shroud region 234 integrated with a phase separator region 236. At least the phase separator region 236 is preferably surrounded by a vacuum jacket 232. The non-cryogenic heat absorption panel 250 includes at least one aperture 251 for receiving the effusion cells (not shown) which provide the materials that are deposited on the substrate.

Figure 1:
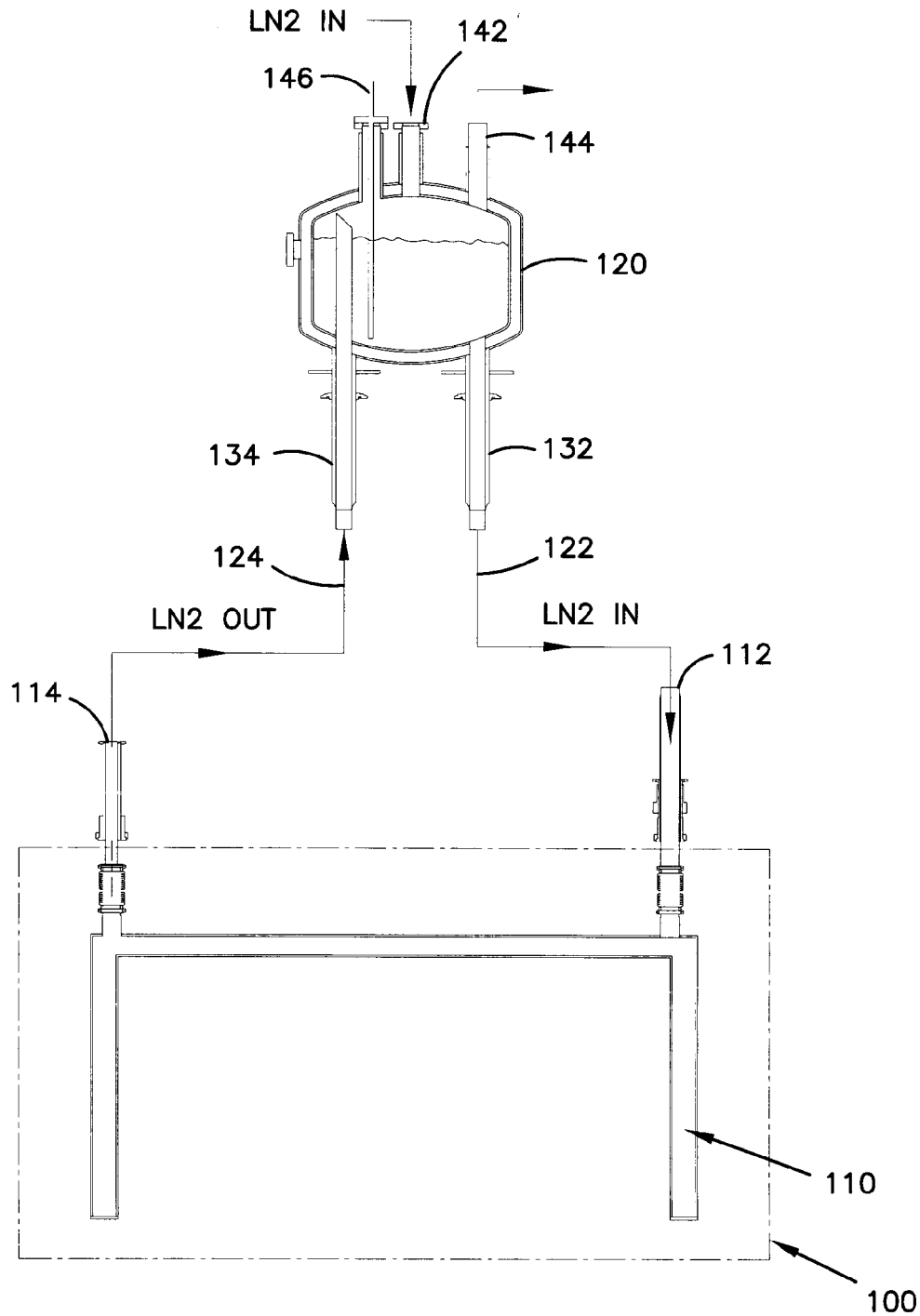
FIG. 1 is a cross-sectional view of an UHV system showing a conventional phase separator.
Figure 2:
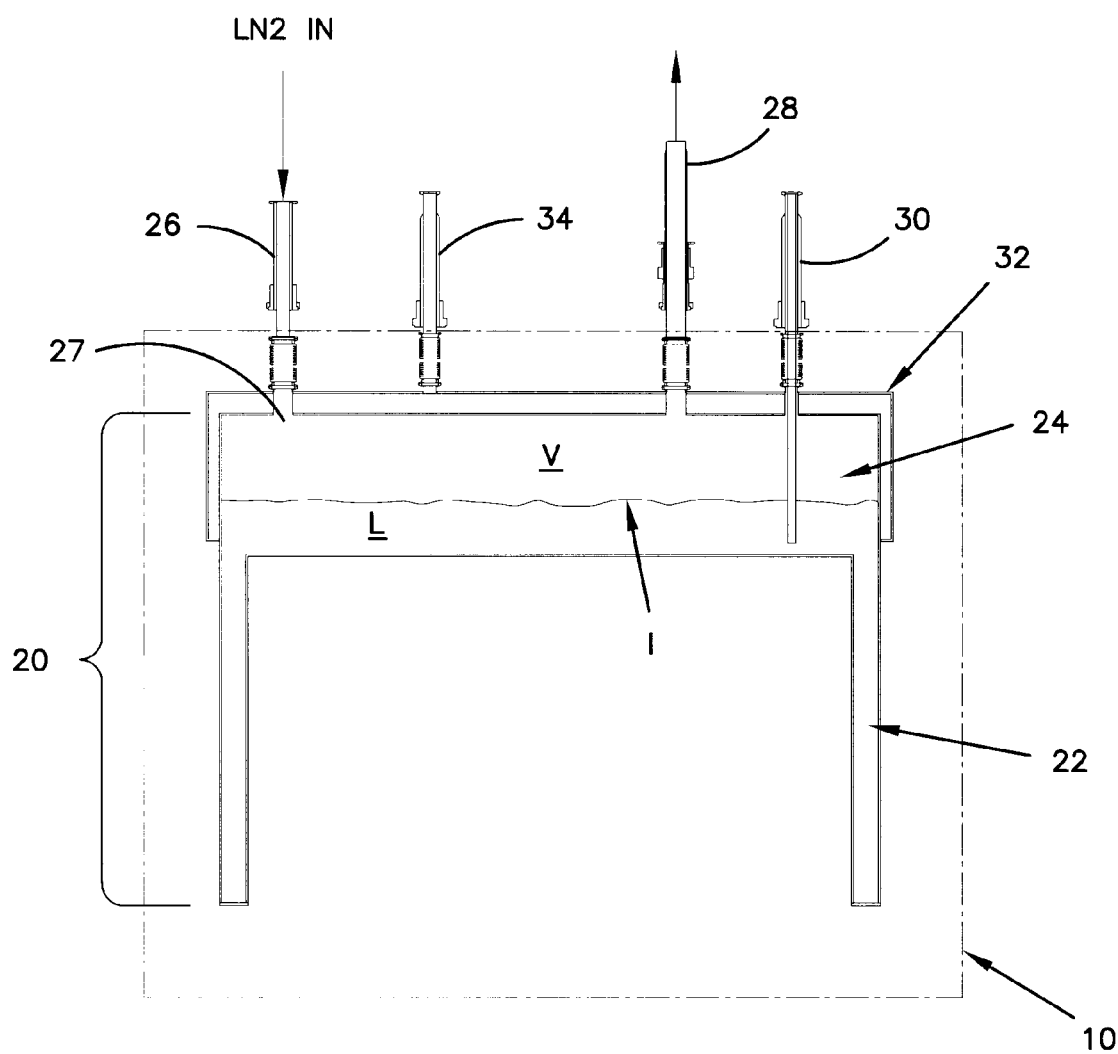
FIG. 2 is a cross-sectional view of the cryogenic panel section of the present invention.

The cryogenic panel portion of the cooling system is more clearly explained with reference to FIG. 2. As shown in FIG. 2, the UHV system includes vacuum chamber 10 with cryo-panel 20 disposed within the chamber. It will be understood that the non-cryogenic cooling panel later described, while not illustrated in FIG. 2, is also disposed within the vacuum chamber 10. Cryo-panel 20 includes cryo-shroud region 22 and phase separator region 24. Liquid nitrogen at a temperature equal to or below its boiling point of 77° K is introduced into the cryo-panel through input port 26 and fill head 27. It is to be understood that input port 26 is connected to a liquid nitrogen supply (not shown) and a fill mechanism (also not shown).

As the liquid nitrogen warms in cryogenic shroud region 22 and vaporizes, the gaseous nitrogen rises into phase separator region 24. Phase separator region 24 provides a vapor-to-liquid interface layer "I" held at near atmospheric pressure. Interface "I" has a large surface area substantially equal to the cross-sectional area of cryo-panel 20. The vapor side "V" of interface "I" is coupled essentially directly to exhaust 28. Interface "I" ensures that the nitrogen vapor may escape the panel smoothly via outlet port 28, causing minimal turbulence and without forming gas bursts or frothing, as occurs in prior art external phase separators.

A level sensor 30 preferably is provided to facilitate maintenance of the desired level of liquid nitrogen within the cryo-panel. Level sensor 30 is coupled operatively to the liquid side "L" of interface "I" and provides a measurable signal indicating the present level of the interface "I".

Vacuum jacket 32 preferably is disposed around the upper end of cryo-panel 20 so that at least the phase separator region 24, and particularly interface "I", is enclosed therein. Vacuum port 34 is connected to a vacuum pump (not shown). An alternate method to produce a vacuum inside the vacuum jacket 32 is to place a cryogenically activated sorption material into the jacket and seal the pump port 34 before introducing liquid nitrogen into the cryoshroud region 22. As the sorption material cools down it absorbs gas molecules and creates a vacuum without the need for external pumping. The use of sorption materials, such as activated charcoal or sodium alumino-silicate, to perform a pumping function is known in the art.

Enclosing interface "I" within vacuum jacket 32 prevents the external surfaces of cryo-shroud region 22 from varying significantly from the nominal 77° K of the internal liquid nitrogen bath, thus optimizing thermal stability and performance. It is envisioned that vacuum jacket 32 may be constructed of several pieces. In this case, it may be desirable to install stabilizers, such as welded rods, to ensure structural rigidity despite extreme temperature variations resulting from cool-down and subsequent return to ambient cycles that occur during normal usage.

Figure 5:
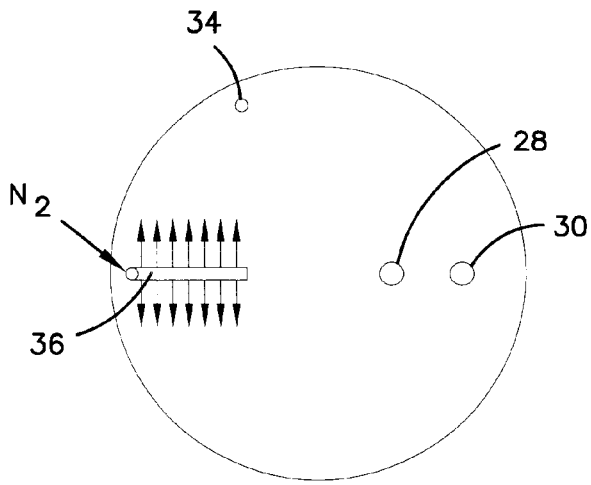
FIG. 5 is a planar top view of the invention as shown in FIG. 3.
Figure 4:
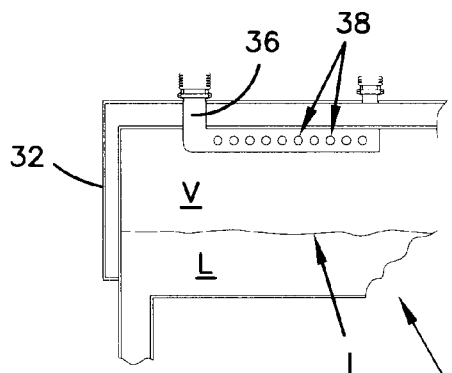
FIG. 4 is an enlarged cross-sectional view of a portion of FIG. 3 showing the "shower head" feature.
Figure 3:
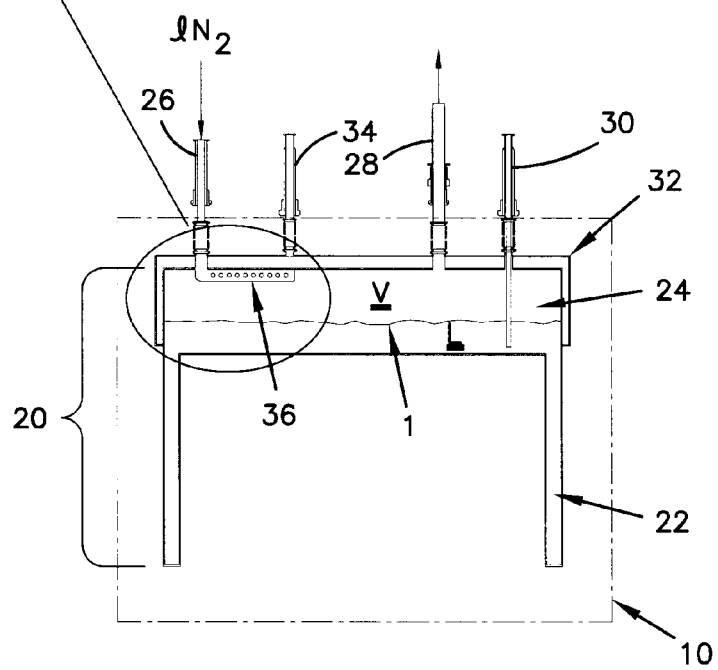
FIG. 3 is a cross-sectional view of the cryogenic panel section of the present invention showing the "shower head" feature.

A Another embodiment of the integrated phase separator showing a "shower head" feature according to the present invention is shown in FIGS. 3–5. In this embodiment, liquid nitrogen fill head 27 is replaced with liquid nitrogen "shower" fill head 36. As shown particularly in FIG. 4, shower fill head 36 includes a plurality of fluid exit apertures 38 through which liquid nitrogen is introduced into cryo-panel 20. This arrangement disperses the liquid nitrogen in a generally horizontal direction, as shown in FIG. 5, which minimizes disturbances of interface "I" and turbulence in the liquid nitrogen reservoir (the liquid side "L" of interface "I").

Figure 7:
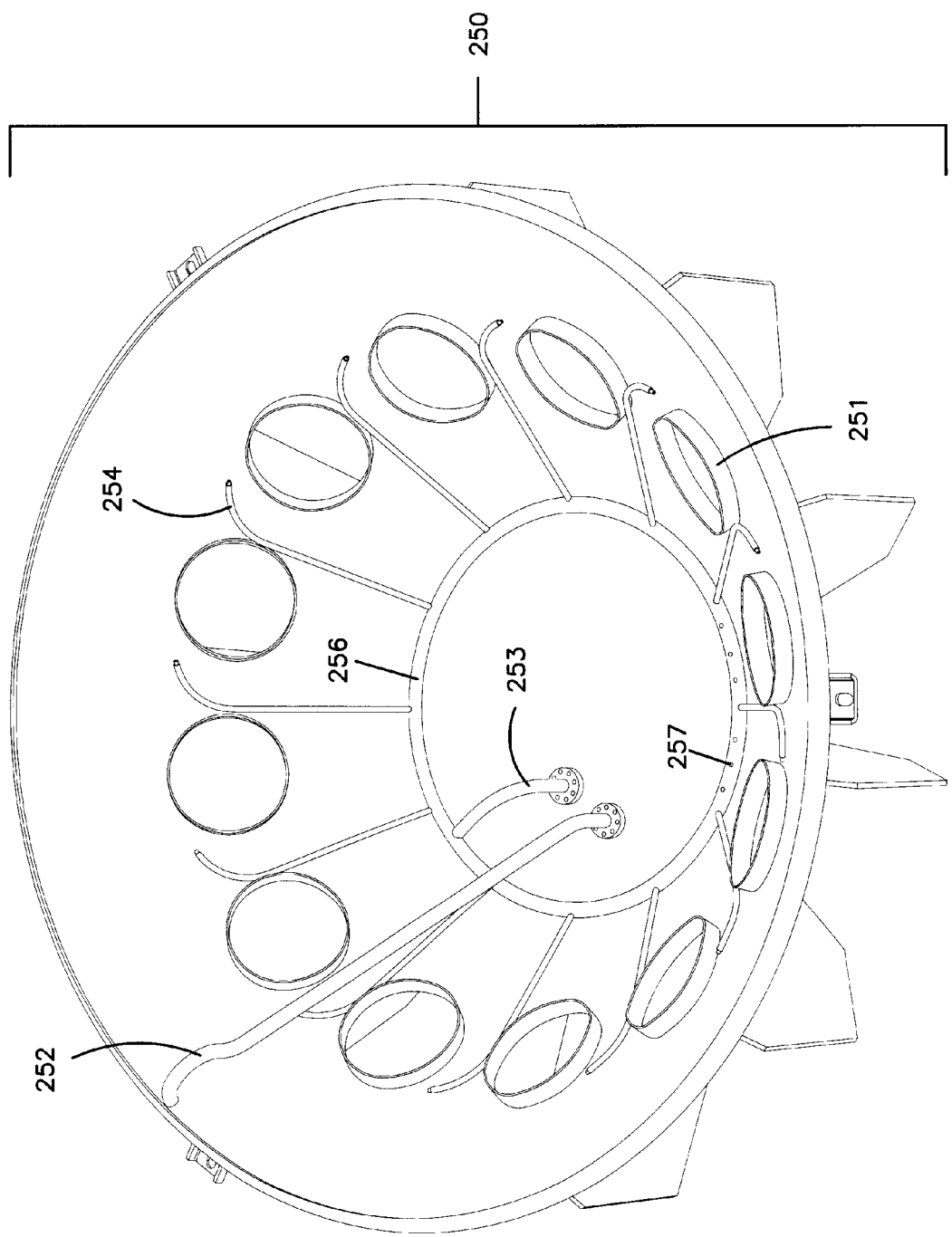
FIG. 7 is a top perspective view of the non-cryogenic panel portion of FIG. 6, illustrated with the upper surface thereof removed, and showing the water introduction mechanisms thereof.

In the dual panel cooling system 200, the non-cryogenic heat absorption panel 250 is preferably filled with water. Liquid nitrogen at a temperature equal to or below its boiling point of 77° K is introduced into the cryogenic panel through input port 226, and vaporized nitrogen is released through exhaust 228. Cold water in introduced into the non-cryogenic heat absorption panel 250 through water inlet port 253, and exits the system through water drainage port 252. In order to illustrate the manner in which water is introduced into the heat absorption panel 250, the inner or upper wall of that panel has been cut away in FIG. 7. As can be seen in FIG. 7, water inlet port 253 is fluidly connected to a ring 256 that, in turn, is fluidly connected to a plurality of curved water fill heads 254. A plurality of water exit holes 257 are radially positioned along the ring. Water exits the fill heads 254 through small holes (not shown) near the top of the fill heads and through the radially positioned holes 257 along the ring. This arrangement helps to maintain the circulation of water in the heat absorption panel 250.

The primary advantage of the dual panel cooling system of the embodiment of FIGS. 6–7 is that it allows the cooling panel 200 to handle heavier heat loads in the area where it is needed, while substantially reducing the amount of expensive liquid nitrogen consumed by the system. The effusion cells generate substantial amounts of heat, which causes those portions cooling panel in that region to heat up substantially. In a cooling system having a single chamber integrated phase separator, this high heat load causes the liquid nitrogen to evaporate very quickly, thus reducing the effectiveness of the overall cooling panel and consuming substantial amounts of liquid nitrogen. In the embodiment of FIGS. 6–7, in contrast, the water in the non-cryogenic heat absorption panel absorbs much of load from the effusion cells, thereby significantly reducing the heat subjected to the cryo-panel and improving the efficiency of using the liquid nitrogen to cool the area surrounding the substrates, where it is most needed.

As mentioned above, one example of an UHV system wherein the present invention is particularly useful is molecular beam epitaxy ("MBE"). In this case, vacuum chamber 10 is a MBE system reaction chamber. Other examples wherein the cooling system of the present invention may be employed include surface analysis instruments, such as Auger Electron Spectrometry ("AES"), Dynamic Secondary Ion Mass Spectrometry ("DSIMS") and low Energy Electron Diffraction ("LEED") microscopes wherein UHV is required to minimize sample surface contamination. Of course, it is to be understood that these examples are illustrative only and other systems and environments may benefit from the use of the present invention.

The above is for illustrative purposes only. Modifications may be made, particularly with regard to size, shape and arrangement of elements, within the scope of the invention as defined by the appended claims.

We claim:

1. A cooling system for an ultra high vacuum system configured to deposit a thin film of material on a substrate located in an active growth region, comprising:
   a. a vacuum chamber;
   b. a first cooling panel disposed within the vacuum chamber having a cryogenic fluid input port and a vapor outlet port, wherein said cryogenic panel includes a cryogenic shroud region configured to at least partially surround said substrate and a phase separator region configured to provide a near atmospheric pressure vapor barrier over the cryogenic fluid so that vapor from the cryogenic fluid may escape smoothly through said vapor outlet port; and
   c. a second cooling panel disposed within the vacuum chamber, configured to address and absorb heat from a source of said film material, having inlet and drainage ports opening into a reservoir and configured to circulate non-cryogenic heat absorbing fluid through said reservoir from said inlet port to said drainage port.

2. The cooling system of claim 1, wherein the cryogenic fluid comprises liquid nitrogen.

3. The cooling system of claim 1, wherein the non-cryogenic fluid comprises water.

4. The cooling system of claim 1, wherein the reservoir comprises a curved chamber.

5. The cooling system of claim 1, wherein said second cooling panel at least partially surrounds a source of said film material.

6. The cooling system of claim 1, wherein said second cooling panel includes at least one opening through which said film material passes when traveling from said material source to said substrate.

7. The cooling system of claim 1, further comprising a fluid delivery system within said reservoir configured to receive said non-cryogenic fluid at said reservoir inlet port and to direct said fluid in circulatory manner within said reservoir.

8. The cooling system of claim 7, wherein said fluid delivery system comprises at least one curved channel in fluid communication with said reservoir inlet port.

9. The cooling system of claim 8, wherein said at lease one curved channel terminates at a spray nozzle.

10. The cooling system of claim 1, further comprising a fluid delivery system within said reservoir configured to receive said non-cryogenic fluid at the reservoir inlet port, said fluid delivery system comprising a conduit member having a plurality of exit holes formed therein for introducing said non-cryogenic fluid therethrough and into said reservoir.

11. The cooling system of claim 1, further comprising a vacuum jacket that surrounds at least a portion of said first cooling panel.

12. The cooling system as recited in claim 11, further comprising a cryogenically activated sorption material in said vacuum jacket for forming a vacuum within said vacuum jacket.

13. The cooling system as recited in claim 1, wherein said vacuum chamber is a reaction chamber of a molecular beam epitaxy system.

14. A cooling system configured for insertion with a vacuum chamber of an ultra high vacuum system configured to deposit a thin film of vaporized material on at least one substrate located in a deposition region, wherein the cooling system comprises:
   a. a first cooling section, wherein the first cooling section comprises:
      i. a cryoshroud region at least partially enclosing the deposition region, wherein the cryoshroud region is adapted to contain a cryogenic fluid;
      ii. a cryogenic fluid input port adapted to receive the cryogenic fluid into the cryoshroud region;
      iii. a vapor outlet port configured to remove vapor created from heating the cryogenic fluid from the cryoshroud region; and
      iv. a phase separator region in fluid connection with the cryoshroud region, wherein the phase separator region provides a near atmospheric pressure vapor barrier over the cryogenic fluid in the first cooling section so that the cryogenic fluid vapor may escape smoothly through said outlet port; and
   b. a second cooling section at least partially enclosing a heated source region, wherein the heated source region is defined by at least one path taken by the vaporized source material to reach the deposition region, wherein the second cooling section comprises:
      i. a reservoir containing a circulating non-cryogenic fluid;
      ii. an inlet port configured to receive the non-cryogenic fluid into the reservoir, and
      iii. a drainage port configured to remove the non-cryogenic fluid from the reservoir.

15. The cooling system of claim 14, wherein the non-cryogenic fluid comprises water.

16. The cooling system of claim 14 wherein said second cooling section further comprises fluid dispersion apparatus within said reservoir configured to forcibly direct said non-cryogenic fluid in circulating manner against the internal walls of said reservoir.

17. A cooling device for a molecular beam epitaxy system, the device comprising:
   a. a reaction chamber;
   b. a first cooling chamber for cooling a portion of the reaction chamber to cryogenic temperatures, wherein the first cooling chamber is situated within the reaction chamber;
   c. a cryogenic source operatively connected to intermittently introduce a cryogenic fluid into the first cooling chamber;
   d. an exhaust through which vapor from the cryogenic fluid exits the first cooling chamber;
   e. a second cooling chamber adapted to contain a non-cryogenic fluid, wherein the second cooling chamber is situated within the reaction chamber;
   f. an inlet port configured to introduce a non-cryogenic fluid into the second cooling chamber;
   g. a drainage port configured to remove the non-cryogenic fluid from the second cooling chamber; and
   h. at least one circulation channel within said second cooling chamber and in fluid communication with said inlet port, configured to circulate the non-cryogenic fluid within the second cooling chamber.

18. The cooling device of claim 17, wherein the first cooling chamber comprises a cryogenic shroud region and a phase separator region; wherein the phase separator region contains a vapor-to-liquid interface having a surface area substantially equal to a cross-sectional area of the cooling device.

19. A cooling device of claim 18, wherein a near atmospheric pressure vapor barrier is disposed within the phase separator region.

20. The cooling device of claim 17, wherein the second cooling chamber defines at least one opening through which at least one effusion source extends.

21. The cooling device of claim 17, wherein the first cooling chamber at least partially surrounds a substrate to be coated in the reaction chamber, and wherein the second cooling chamber at least partially surrounds an effusion source for evaporating the material to be deposited on the substrate.

* * * * *

UNITED STATES PATENT AND TRADEMARK OFFICE
CERTIFICATE OF CORRECTION

PATENT NO. : 6,718,775 B2
DATED : April 13, 2004
INVENTOR(S) : Colombo et al.

It is certified that error appears in the above-identified patent and that said Letters Patent is hereby corrected as shown below:

Title page,
Item [56], References Cited, U.S. PATENT DOCUMENTS, add

| -- Document No. | Date | Name |
|---|---|---|
| 2001/0010203 | 08/02/2001 | Nakabayashi et al. -- |

Under FOREIGN DOCUMENTS, add

| -- Document No. | Date | Name |
|---|---|---|
| 0 286 181 A2 | 10/12/1988 | EP |
| 57 200 296 | 12/08/1982 | JP (abstract only) |
| WO 02/24983 A2 | 03/28/2002 | PCT -- |

Under OTHER DOCUMENTS, add
-- Rupp, T. et al., "Silicon-germanium molecular beam epitaxy system for high-quality nanostructures and devices," *Journal of Crystal Growth*; Vol. 183, pp. 99-108(1988) --

Column 2,
Line 65 "[[-]]" should be deleted.

Column 5,
Line 15, "A Another" should read -- Another --
Line 53, "portions cooling" should read -- portions of the cooling --
Line 60, "much of load" should read -- much of the heat load --

Column 6,
Line 56, "said at lease one curved" should read -- said at least one curved --

Signed and Sealed this

Fourteenth Day of September, 2004

JON W. DUDAS
*Director of the United States Patent and Trademark Office*